United States Patent [19]

Kuwano et al.

[11] Patent Number: 4,613,880
[45] Date of Patent: Sep. 23, 1986

[54] LIGHT SENSITIVE APPARATUS

[75] Inventors: Yukinori Kuwano; Shoichi Nakano, both of Osaka; Masaru Takeuchi, Kyoto, all of Japan

[73] Assignee: Sanyo Electric Co., Ltd., Japan

[21] Appl. No.: 759,496

[22] Filed: Jul. 26, 1985

Related U.S. Application Data

[63] Continuation of Ser. No. 406,441, Aug. 9, 1982.

[30] Foreign Application Priority Data

Aug. 19, 1981 [JP] Japan ................ 56-129836

[51] Int. Cl.⁴ ............... H01L 45/00; H01L 27/14
[52] U.S. Cl. .......................... 357/2; 357/30; 357/68; 357/70; 357/5
[58] Field of Search ............ 357/30, 2, 72, 68, 5

[56] References Cited

U.S. PATENT DOCUMENTS

| | | | |
|---|---|---|---|
| 3,820,150 | 6/1974 | Nicolaides | 357/2 |
| 4,016,589 | 3/1977 | Tanimura | 357/30 |
| 4,217,148 | 8/1980 | Carlson | 357/2 |
| 4,272,641 | 6/1981 | Hanak | 357/2 X |
| 4,365,107 | 12/1982 | Yamauchi | 357/2 |
| 4,371,882 | 2/1983 | Morris | 357/4 |
| 4,388,482 | 6/1983 | Hamakawa | 357/2 X |

Primary Examiner—Martin H. Edlow
Attorney, Agent, or Firm—Darby & Darby

[57] ABSTRACT

A light sensitive apparatus includes a light sensitive body and at least two leads electrically connected thereto so that the light sensitive body can be mechanically supported by the leads. The light sensitive body includes a light transmissible substrate, a transparent electrode formed on the substrate, a thin film of non-single crystal semiconductor layer deposited on the transparent electrode, a first electrode disposed on the non-single crystal semiconductor, and the second electrode disposed on an exposed portion of the transparent electrode. The first lead is connected to the first electrode and the second lead is connected to the second electrode.

9 Claims, 14 Drawing Figures

LIGHT SENSITIVE APPARATUS

This is a continuation of application Ser. No. 406,441, filed Aug. 9, 1982.

BACKGROUND OF THE INVENTION

1. Field of the Invention

The present invention relates to a light sensitive apparatus including a non-single crystal semiconductor. More particularly, the present invention relates to a light sensitive apparatus including a light sensitive body comprising a light transmissible substrate and a thin film of non-single crystal semiconductor layer deposited on a major surface of the substrate, and at least two lead members electrically connected to the light sensitive body.

2. Description of the Prior Art

Demand of a light sensitive apparatus for electrically detecting light, that is, a so-called light sensor, has been increased in various fields as the usage or utilization of an optoelectronics technique increases more and more.

FIG. 1 is a front view of a conventional light sensitive apparatus and FIG. 2 is a cross-sectional view taken along a line A-A' in FIG. 1. Such a conventional light sensitive apparatus comprises a semiconductor substrate 1 comprised of a single crystal silicon having a PN junction 2, a coating film 3 of silicon dioxide ($SiO_2$) formed on a major surface of the semiconductor substrate 1 by an oxidation process, a surface electrode 4 formed of aluminium (Al) and the like coupled to a region of one conductivity type through the coating film 3, and a bottom surface electrode 5 formed of gold (Au) and the like contacted in an ohmic contact manner with a region of an opposite conductivity type in the other major surface of the semiconductor substrate 1, so that a light sensitive body 6 of a so-called photodiode is formed. A first lead member 7 comprised of a lead frame comprises a flag-like portion 7a in the upper portion thereof, as shown in FIG. 3. The light sensitive body 6 is disposed on and fixed to the flag-like portion 7a so that the first lead member 7 is electrically connected to the bottom surface electrode 5. On the other hand, a second lead member 8 comprised of a lead frame is electrically connected to the surface electrode 4 through a wire lead 9 of Au and the like. The connection of the light sensitive body 6 with the two lead bodies 7 and 8 including the wire lead 9 are surrounded and protected by a mold body 10 comprised of a transparent epoxy resin which can transmit light. The mold body 10 is formed in a predetermined shape by a transfer mold process since the mold body 10 needs a uniform light transmission characteristic.

However, since the surface electrode 3 in such a light sensitive apparatus is electrically connected to the second lead member 8 through a fine wire lead 9, an efficiency for operation is very low and, in addition, there has been a danger that the fine wire lead 9 may be disconnected due to pressurized insertion of the resin in transfer-molding the mold body 10. Further, in order to enable the mold body 10 to transmit light which is to be applied to the PN junction 2 in the light sensitive body 6, an incident surface of the mold body 10 must be processed to become a mirror surface.

Japanese Patent Publication No. 33868/1981 (Japanese Patent Application No. 23361/1979) discloses a structure of a photovoltaic device wherein a sintering layer of cadmium sulfide and a sintering layer of cadmium telluride are stacked in this order, and a first electrode is disposed on the sintering layer of cadmium telluride and a second electrode is disposed on the sintering layer of cadmium sulfide, each of the first and second electrodes being connected to a wire lead. In accordance with this structure of a photovoltaic device, since the sintering layers are used as a semiconductor layer, the respective thickness of the layers can not be made in a micron order. Therefore, there is a significant level difference between two electrodes, the level difference adversely affecting a strength for supporting the photovoltaic device by a lead wire. It should be desirable to reduce such level difference.

SUMMARY OF THE INVENTION

Briefly stated, a light sensitive apparatus in accordance with the present invention comprises a light sensitive body including a light transmissible substrate and a thin film of a non-single crystal semiconductor layer deposited on a major surface of the substrate, and at least two lead members electrically connected to the light sensitive body so that the light sensitive body can be mechanically supported by the lead members.

In a preferred embodiment of the present invention, the thin film of a non-single crystal semiconductor layer is less than 1 $\mu$in thickness. The non-single crystal semiconductor layer comprises an amorphous semiconductor. Preferably, the amorphous semiconductor is an amorphous silicon.

In a preferred embodiment of the present invention, a transparent electrode is disposed between the light transmissible substrate and the thin film of a non-single crystal semiconductor layer. In addition, a first electrode is provided on the non-single crystal semiconductor layer and a second electrode is provided on an exposed portion of the transparent electrode. The first lead member is connected to the first electrode and the second lead member is connected to the second electrode.

In a more preferred embodiment of the present invention, the shapes of the first and second lead members are different from each other, the connected portion of the first lead member in which the first lead member is connected to the first electrode being larger than a connected portion of the second lead member in which the second lead member is connected to the second electrode. As a result, the mechanical support for connection of the light sensitive body with the lead members are further strengthened.

In accordance with another embodiment of the present invention, the transparent electrode extends to at least one side portion of the substrate and the second electrode and the second lead member are disposed on the portion of the transparent electrode disposed on the side portion of the substrate.

In accordance with a further preferred embodiment of the present invention, the non-single crystal semiconductor layer extends over the transparent electrode to the major surface of the light transmissible substrate and the first electrode extends to cover both of the transparent substrate and the exposed portion of the major surface of the substrate. The first lead member is disposed on the portion of the first electrode which is disposed on the substrate.

Accordingly, a principal object of the present invention is to provide a light sensitive apparatus comprising a light sensitive body including a light transmissible substrate and a thin film of a non-single crystal semiconductor layer deposited on the major surface of the substrate, and at least two lead members electrically connected to the light sensitive body, so that the light sensitive body can be mechanically supported by the two lead members.

The object and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 4:
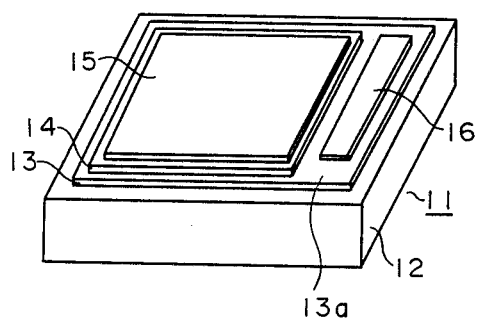
FIG. 4 is a perspective view of a light sensitive body which is a main portion of a light sensitive apparatus of the present invention.

FIG. 4 shows a perspective view of a light sensitive body in a light sensitive apparatus of the present invention. The light sensitive body 11 comprises a light transmissible substrate 12 such as glass, acrylic resin and the like, a transparent electrode 13 deposited on a major surface of the substrate 12, such as tin oxide ($SnO_2$), indium oxide ($In_2O_3$), indium-tin oxide ($In_2O_3$-$SnO_2$) and the like, a thin film of a non-single crystal semiconductor layer 14 having PN junction, PIN junction, Schottky junction or heterojunction, such as amorphous or poly-crystal semiconductor, the semiconductor layer 14 covering most of the transparent electrode 13, a first electrode 15, such as aluminium (Al), silver (Ag) and the like, provided on the semiconductor layer 14, and a second electrode 16 disposed on an exposed portion 13a of the transparent electrode 13, the second electrode 16 being formed simultaneously with the first electrode 15. The transparent electrode 13 is formed in a micron order by an electron beam evaporation process, and the non-single crystal semiconductor layer 14 is formed in a micron order or in a thin film manner using a plasma discharging process or a high frequency sputtering process in case where the non-single crystal semiconductor layer 14 is comprised of amorphous material, or using process of evaporation, print, spray, vapor growth deposition or the like in case where the non-single crystal semiconductor layer 14 is of polycrystal structure. As a result, the first and second electrodes 15 and 16 can be disposed so that the level difference between the first and second electrodes 15 and 16 is almost negligible.

Figure 5:
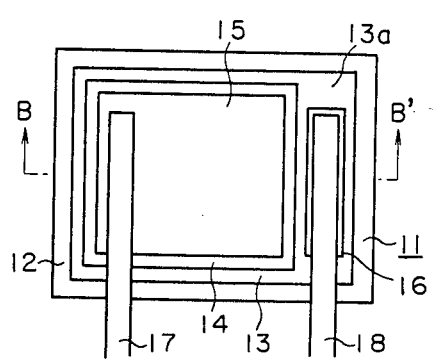
FIG. 5 is a bottom view of the light sensitive apparatus of the present invention as viewed from the bottom of the light sensitive apparatus.
Figure 6:
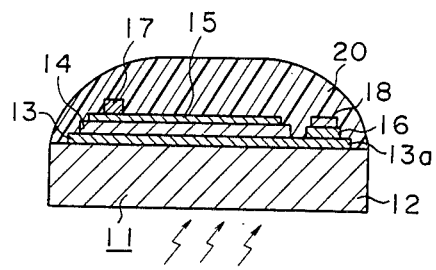
FIG. 6 is a cross-sectional view taken along in B-B' line in FIG. 5.
Figure 7:
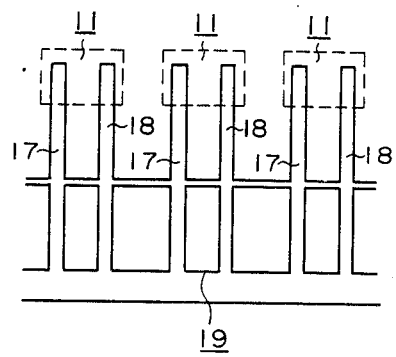
FIG. 7 shows an arrangement of a plurality of the light sensitive bodies and lead members connected thereto wherein these lead members are connected in common.

FIG. 5 is a bottom view of a light sensitive apparatus of one embodiment of the present invention as viewed from the bottom of the apparatus and FIG. 6 is a cross-sectional view taken along in a B-B' line in FIG. 5. As can be seen from FIGS. 5 and 6, a first lead member 17 and a second lead member 18 are electrically coupled, by a silver (Ag) paste and the like, to the first and second electrodes 15 and 16, respectively, which are formed on the same side of the light sensitive body 11. The first and second lead members 17 and 18 are comprised of a pair of lead frames 19 which are nickel-plated copper. It should be noted that the light sensitive body 11 can be mechanically and securely supported by connecting both lead members 17 and 18 to the light sensitive body 11. In addition, a mold body such as an epoxy resin and the like covers the non-single crystal semiconductor layer 14 deposited on one major surface of the light transmissible substrate 12, the first and second electrodes 15 and 16, and the lead members 17 and 18 so that the structure of the light sensitive apparatus is further strengthened. The mold body is not necessarily transparent because the light is applied to the other major surface of the light transmissible substrate 12, that is, a front surface of the light sensitive apparatus as shown in an arrow in FIG. 6.

Thus, since the thin film of a non-single crystal semiconductor layer 14 can be directly deposited, in a micron order, on the light transmissible substrate 12, such as glass, acrylic resin and the like, and the first and second electrodes 15 and 16 are disposed at the substantially same level in the back surface of the semiconductor layer which does not adversely affect light irradiation, the above described electrical coupling and mechanical support by the first and second lead members 17 and 18 become possible.

Now, a method for manufacturing an amorphous semiconductor device used as the above described non-single crystal semiconductor layer 14 will be described in the following.

First, a light transmissible substrate 12 on one major surface of which a transparent electrode 13 is selectively evaporated is disposed between electrodes in a reaction furnace with low vacuum. In that condition, a monosilane ($SiH_4$) gas is introduced into the furnace and a high frequency plasma discharging is made between the above described electrodes. High energy electrons excited by the high frequency come into collision with the material gas and thus an amorphous silicon is deposited on the light transmissible substrate 12 by decomposition of gas material and/or by reaction between the activated gas. If diborane ($B_2H_6$) is added as an impurity to the source material of monosilane ($SiH_4$), the above described amorphous silicon can be changed to P-type and if phosphine ($PH_3$) is added as an impurity to the source material of $SiH_4$, the amorphous silicon can be changed to N-type. The basic reaction conditions for PIN junction type amorphous silicon are described in the following.

| | |
|---|---|
| Temperature of Substrate | 200–450° C. |
| The Number of High Frequency | 13.56 MHz |
| High Frequency Power | 100 W |
| Gas Pressure | 1 Torr |
| P Layer 50–100Å | (PH$_3$/SiH$_4$: 2.4%) |
| I Layer 5000–7000Å | |
| N Layer - 300Å | (B$_2$H$_6$/SiH$_4$: 0.9%) |
| Flow Rate | 40 cc/min |
| Rate of Growth | 1 μm/hr |

In addition, if gases to be introduced are properly selected in the above described manufacturing method, an amorphous silicon containing hydrogen, fluorine, carbon, nitrogen, oxigen and the like in the respective P, I and N layers can be obtained.

Further, an amorphous semiconductor may comprise selenium, chalcogen compound and the like.

The thickness of the amorphous semiconductor thus formed is less than 1μ and thus the level difference between the first and second electrodes 15 and 16 becomes less than 1μ. Therefore, it is not necessary to perform a process for removing a level difference between the first and second lead members 17 and 18, which gives a good efficiency for manufacturing.

Figure 1:
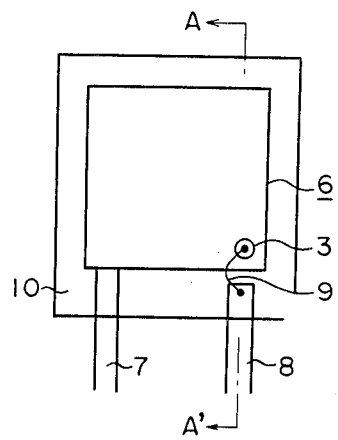
FIG. 1 is a front view of a conventional light sensitive apparatus.
Figure 2:
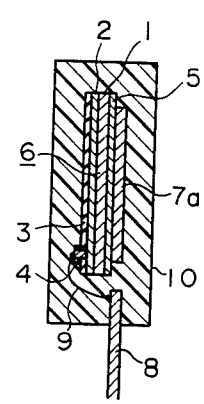
FIG. 2 is a sectional view taken along in line A-A' in FIG. 1.
Figure 3:
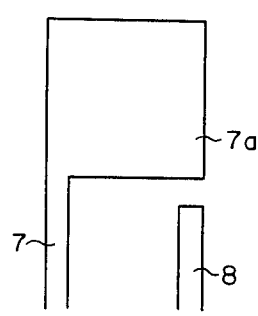
FIG. 3 is a front view of the lead members used in the conventional light sensitive apparatus.
Figures 8A, 8B, 8C:
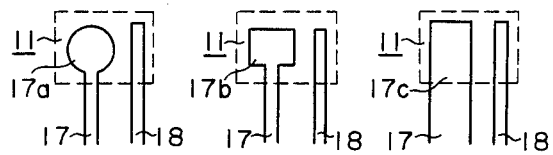
FIGS. 8A, 8B and 8C are a bottom view showing another embodiments of the main portion of the FIG. 7 embodiment.

FIGS. 8A to 8C are modifications of the first and second lead members 17 and 18 used in the light sensitive apparatus of the present invention. More particularly, in the above described embodiments, a sufficient strength for supporting a light sensitive body 11 can be obtained since the width of the first and second lead members 17 and 18 are equal to each other and the first and second lead members 17 and 18 are connected to the first and second electrodes 15 and 16, respectively, on the same side of the substrate. However, if necessary, the upper portion of the first lead member 17 may be shaped as a flag-like portion just as the portion 7a shown in FIG. 3, or as a circle portion 17a (FIG. 8A), a rectangular portion 17b (FIG. 8B). Alternatively, the width of the first lead member 17 per se may be made larger than that of the second lead member 18.

Figure 9:
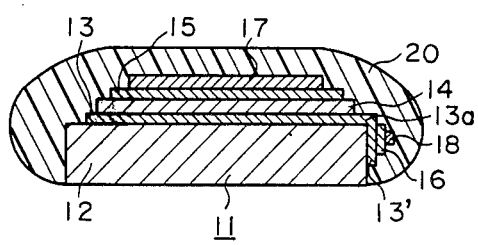
FIG. 9 shows a cross-sectional view of another embodiment of the light sensitive apparatus of the present invention.

FIG. 9 shows a cross-sectional view of another embodiment of the present invention. In this embodiment, the transparent electrode 13 extends to the side surface of the light transmissible substrate 12 on which the connection of the second electrode 16 with the second lead member 18 is made. According to this particular structure, it is possible to cover with a non-single crystal semiconductor layer 14 an exposed portion 13a of the transparent electrode 13 which was occupied by the second electrode 16 in the major surface of the light transmissible substrate 12 in the above described embodiment, and thus the light sensitive area is increased. However, a process for providing a transparent electrode 13' and the second electrode 16 on the side surface becomes further necessary. In such a case, the first lead member 17 should have a flag-like shape 7a (FIG. 3), a circular shape 17a (FIG. 8A), a rectangular shape 17b (FIG. 8B) or a shape 17c (FIG. 8C) having a wider width so that it compensates for the decrease of the strength for supporting the light sensitive body 11, which is caused due to the fact that the second lead member 18 support the light sensitive body 11 on the side surface.

Figure 10:
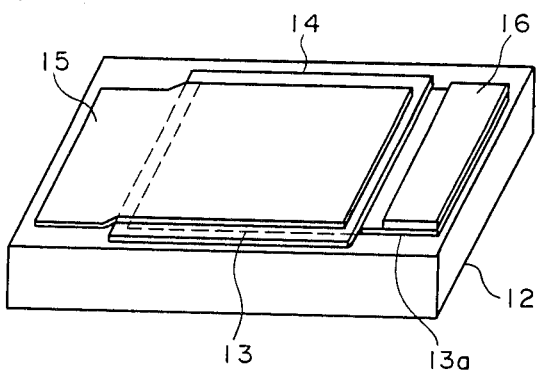
FIG. 10 is a perspective view of a light sensitive body which is a main portion of the light sensitive apparatus in accordance with a further embodiment of the present invention.
Figure 11:
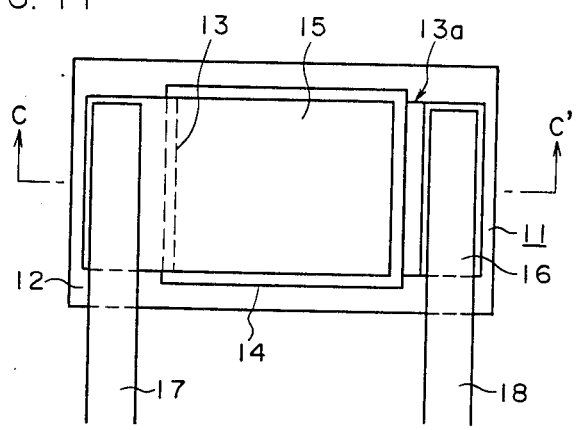
FIG. 11 is a bottom view of the FIG. 10 embodiment as viewed from the bottom of the light sensitive apparatus.
Figure 12:
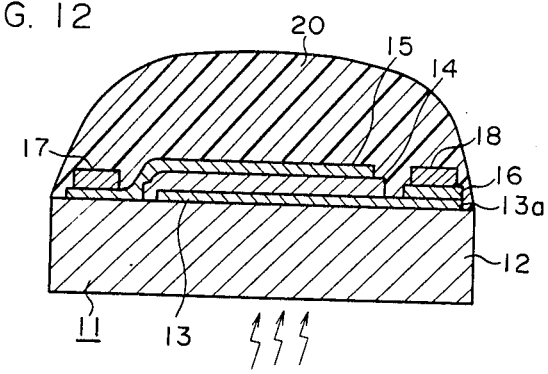
FIG. 12 is a cross-sectional view taken along in C-C' line in the FIG. 10 embodiment.

FIGS. 10 to 12 show a further embodiment of the present invention, which correspond to FIGS. 4 to 6, respectively. Therefore, in FIGS. 10 to 12, the same reference numerals are labeled in the same or corresponding portions. Usually, a lead member and electrode are bonded together by means of a supersonic soldering. However, such soldering sometimes damaged an amorphous semiconductor layer. Accordingly, preferably the lead member should be connected to the portion of the electrode under which the amorphous semiconductor layer is not disposed, rather than the portion of the electrode under which the amorphous semiconductor layer is disposed. The FIGS. 10 to 12 embodiment includes a modification for satisfying such requirement. The different point from the FIGS. 4 to 6 embodiment is that the lead frame 17 is fixed to the portion in which the amorphous semiconductor layer 14 is not provided. More particularly, as best shown in FIG. 12, the amorphous semiconductor layer 14 is deposited on the transparent electrode 13 so as to extend to the major surface of the substrate 12. Thereafter, the first electrode 15 is also disposed on the amorphous semiconductor layer 14 so as to extend to the major surface of the substrate 12. As a result, one end portion of the first electrode 15 is directly disposed on the surface of the substrate 12. The first lead member 17 is connected to the end portion of the first electrode 15. In addition, it should be noted that the amorphous semiconductor layer 14 covers a whole transparent electrode 13 except one end 13a thereof, so that a non-linearity of a light current to an amount of light, which non-linearity is caused due to the dark current in the peripheral of an effective light receiving area, is improved. The remaining structure is exactly the same as the FIGS. 4 to 6 embodiment. Preferably, in order to strengthen the adhesive force between the substrate 12 and the first electrode 15 which is placed under the first lead member 17, another transparent electrode may be interposed, in the same pattern as the first lead member 17, between the substrate 12 and the portion of the first electrode 15 which is placed under the first lead member 17.

In the above described embodiments, a non-single crystal semiconductor layer 14 is of a type having junctions such as PIN junction, Schottky junction and the like and utilizing a photovoltaic effect that a photovoltaic force is generated in response to light irradiation. However, a non-single crystal semiconductor layer 14 may be of a type having no junction such as PIN junction, Schottky junction and the like and utilizing a photoconductive effect that an electric conductivity is increased in response to light irradiation since the specific effect of the present invention is not prevented.

As apparent from the above described description, in accordance with the present invention, since a light sensitive body including a non-single crystal semiconductor layer deposited on one major surface of a light transmissible substrate is electrically connected to at least two lead members so that the light sensitive body can be mechanically supported by the two lead members, a fine wire lead used in a conventional light sensitive apparatus comprised of a single crystal semiconductor is not needed and thus complexity of manufacturing can be avoided and a possible accident that the wire lead is disconnected can be also avoided. In addition, since light is applied to a semiconductor layer through a light transmissible substrate, it is not necessary to process an incident surface as a mirror surface just as a conventional apparatus. Furthermore, in accordance with the present invention, since more cheaper non-single crystal semiconductor than a conventional single crystal semiconductor can be used, a further decrease of cost can be achieved, as well as simplification of manufacturing process and increase of yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light sensitive apparatus comprising:
   a light-transmissible substrate having a major surface;
   a first, transparent electrode deposited on said major surface of said light-transmissible substrate;
   a thin film layer of a non-single crystal semiconductor material deposited on said transparent electrode so as to leave a portion of said transparent electrode and a corresponding side surface of said transparent electrode exposed and so as to completely cover the remaining portion of said transparent electrode including the remaining opposite side surface thereof;
   a second electrode disposed on said non-single crystal semiconductor layer and an said major surface of said substrate;
   a first lead member electrically connected to said exposed portion of the transparent electrode and extending along the surface of said exposed portion;
   a second lead member electrically connected to said second electrode and extending along the surface of said second electrode;
   said first and second lead members being such as to be capable of mechanically supporting said light sensitive apparatus; and
   an electrically conductive layer being provided between the exposed portion of said first transparent electrode and said first lead member connected thereto.

2. A light sensitive apparatus in accordance with claim 1, wherein said second electrode extends beyond said non-single crystal semiconductor layer onto the major surface of the substrate, so that a portion of said second electrode is disposed on the major surface of the substrate, and said second lead member is disposed on said portion of said electrode deposited on the major surface of the substrate.

3. A light sensitive apparatus in accordance with claim 1, wherein said electrically conductive layer is formed of the same material as said second electrode.

4. A light sensitive apparatus in accordance with claim 2, wherein said electrically conductive layer is formed of the same material as said second electrode.

5. A light sensitive apparatus in accordance with claim 1, wherein the second lead member extends along the surface of said second electrode.

6. A light sensitive apparatus comprising:
   a light-transmissible substrate having a major surface;
   a first, transparent electrode deposited on said major surface of said light-transmissible substrate;
   a thin film layer of a non-single crystal semiconductor material deposited on said transparent electrode so as to leave a portion of said transparent electrode and a corresponding side surface of said electrode exposed and so as to completely cover the remaining portion of said transparent electrode including the remaining opposite side surface thereof;
   a second electrode disposed on said non-single crystal semiconductor layer;
   a first lead member electrically connected to said exposed portion of the transparent electrode and extending along the surface of said exposed portion; and
   a second lead member electrically connected to said second electrode and extending along the surface of said second electrode;
   said first and second lead members being such as to be capable of mechanically supporting said light sensitive apparatus, said second electrode extending beyond said non-single crystal semiconductor layer onto the major surface of the substrate, so that a portion of said second electrode is disposed on the major surface of the substrate, and said second lead member is disposed on said portion of said electrode deposited on the major surface of the substrate.

7. A light sensitive apparatus in accordance with claim 6, wherein an electrically conductive layer is provided between the exposed portion of the first transparent electrode and the first lead member connected thereto.

8. A light sensitive apparatus in accordance with claim 7, wherein said electrically conductive layer is formed of the same material as said second electrode.

9. A light sensitive apparatus in accordance with claim 6, wherein the second lead member extends along the surface of said second electrode.

* * * * *